United States Patent [19]

Strong

[11] Patent Number: 5,875,717
[45] Date of Patent: Mar. 2, 1999

[54] ASSEMBLY AND METHOD FOR PRODUCING FLAT PRINTING PLATES

[75] Inventor: Kenneth M. Strong, Hockessin, Del.

[73] Assignee: MacDermid Imaging Technology, Incorporated, Waterbury, Conn.

[21] Appl. No.: 997,626

[22] Filed: Dec. 23, 1997

[51] Int. Cl.[6] .................................................. G03B 27/04
[52] U.S. Cl. .......................................... 101/401.1; 355/99
[58] Field of Search .............................. 101/401.1, 463.1, 101/467; 355/89, 99, 113; 248/126, 176.1, 219.2; 108/159

[56] References Cited

U.S. PATENT DOCUMENTS

| | | | |
|---|---|---|---|
| 4,600,667 | 7/1986 | Uchida | 430/22 |
| 4,618,550 | 10/1986 | Uchida | 430/11 |
| 4,927,723 | 5/1990 | Cusdin | 430/15 |
| 5,213,949 | 5/1993 | Kojima et al. | 430/273 |
| 5,275,919 | 1/1994 | Kawatsuji et al. | 430/306 |
| 5,813,342 | 9/1998 | Strong | 101/401.1 |

*Primary Examiner*—Stephen R. Funk
*Attorney, Agent, or Firm*—William A. Simons; William B. Slate; Wiggin & Dana

[57] ABSTRACT

An assembly for producing printing plates from photopolymerizable resins includes an upper fixture assembly and a lower fixture assembly. The upper fixture assembly includes an upper glass plate, and an upper shutter box in which an upper UV light source is located. The upper fixture is mounted on a guide post so that the upper fixture assembly can be raised and lowered relative to a lower fixture assembly. The lower fixture assembly includes a lower light bank table containing a lower UV light source, and a lower glass plate on which the resin layer is cast. A doctor blade is drawn over the resin layer to smooth the latter on the lower glass plate. The resin layer is then exposed to UV light through a print pattern-defining negative so as to selectively harden the resin layer and form a printing plate that is defined by the negative pattern. In order to maintain the flatness of the lower glass plate, and thus the thickness of the resin layer during the doctor blade step, a support post is positioned in the lower fixture to support the center of the lower glass plate. The support post has transparent portions so as not to interfere with subsequent light transmission to the resin layer.

5 Claims, 2 Drawing Sheets

5,875,717

ASSEMBLY AND METHOD FOR PRODUCING FLAT PRINTING PLATES

BACKGROUND OF THE INVENTION

1. Field of the Invention

This invention relates to an improved assembly for producing flat printing plates; and more particularly to an assembly of the character described wherein the resin-supporting glass plate is structurally reinforced so as to maintain its planar condition in the assembly without retarding light transmission through the glass plate.

2. Description of the Art

An assembly for producing printing plates by selectively cross-linking a photo-polymerizable resin layer typically includes an upper fixture assembly having an upper UV light bank, and a lower fixture assembly containing a lower UV light bank. Both assemblies are provided with glass plates, which are brought together when the resin layer is processed. The resin layer is cast on a transparent sheet, which is positioned on the lower glass plate, and the resin layer may be smoothed and evened by means of a doctor blade, which passes over the resin layer. After the smoothing operation, the upper fixture is properly positioned and the light banks are activated so as to selectively cross-link the resin layer so as to form the printing plate. The selective cross-linking is accomplished by means of a photo negative of the pattern desired for the printing plate. The lower UV light bank is directed against the lower surface of the resin layer through the negative. The upper UV light bank is directed against the upper surface of the resin layer so as to form a cross linked floor portion of the printing plate. Excess liquid resin which is not cross linked in the process is removed from the cross linked printing plate.

The aforesaid assembly can be used to produce relatively large area printing plates, but in order to maximize printing plate and print image quality, the lower glass plate must be maintained as flat as possible. The larger the printing plate, the heavier the resin layer that is deposited on the lower glass plate, and the greater the tendency of the lower glass plate to bow downwardly at its center since it is only supported on its edges. The use of a doctor blade also increases bending of the lower glass plate, which results in a thicker resin layer at the center of the lower glass plate. The net result is a resin layer which may not be flat, and which may have a thicker central portion. It would be desirable to be able to provide an auxiliary support for the lower glass plate so as to maintain the flatness of the lower glass plate during production of any size printing plate, and also to allow the production of larger printing plates than are presently feasible.

BRIEF SUMMARY OF THE INVENTION

This invention relates to an improved assembly for producing flat printing plates; and more particularly to an assembly of the character described wherein the resin-supporting glass plate is structurally reinforced so as to maintain its planar condition in the assembly without retarding UV light transmission through the glass plate. The assembly of this invention allows the production of larger printing plates and printing plates with more accurately controlled printing surfaces. The lower glass plate is structurally reinforced by means of a support post, which is mounted on the lower fixture assembly, and which support post contacts the lower surface of the lower glass plate. The support post is vertically adjustable and includes a transparent portion that allows light from the lower UV light bank to reach the resin layer unimpeded so that the contoured printing surface of the printing plate layer floor will be accurately cross linked.

Specifically, the support post includes a metal lower pedestal portion, which is fastened to the lower fixture assembly. The upper portion of the support post that passes through the lower light bank area is transparent, and is mounted on the lower metal pedestal portion. The connection between the metal pedestal and the upper transparent portion is preferably a screw threaded connection so that the upper portion of the support post can be infinitesimally raised or lowered relative to the lower glass plate and the support post pedestal. By providing an adjustable connection between the upper portion of the support post and the lower pedestal, the assembly can be used on different sized lower fixture assemblies; and by providing an upper portion of the support post which is transparent, the cross linking light rays which emanate from the lower light bank will not be prevented from evenly cross linking the entire contoured printing surface of the printing plate, and the thickness of the resin layer can be evenly maintained.

It is therefore an object of this invention to provide an assembly for supporting a central portion of the lower glass plate in a fixture for forming photo polymerized printing plates.

It is a further object of this invention to provide an assembly of the character described which is vertically adjustable for use in different sized lower fixture assemblies.

It is an additional object of this invention to provide an assembly of the character described which will not impede the UV light transmission of the lower surface of the lower glass plate and to the resin layer being cross linked.

These and other objects and advantages of the invention will become more readily apparent from the following detailed description of a preferred embodiment of the invention when taken in conjunction with the accompanying drawings, in which:

DETAILED DESCRIPTION OF THE PREFERRED EMBODIMENTS

Figure 1:
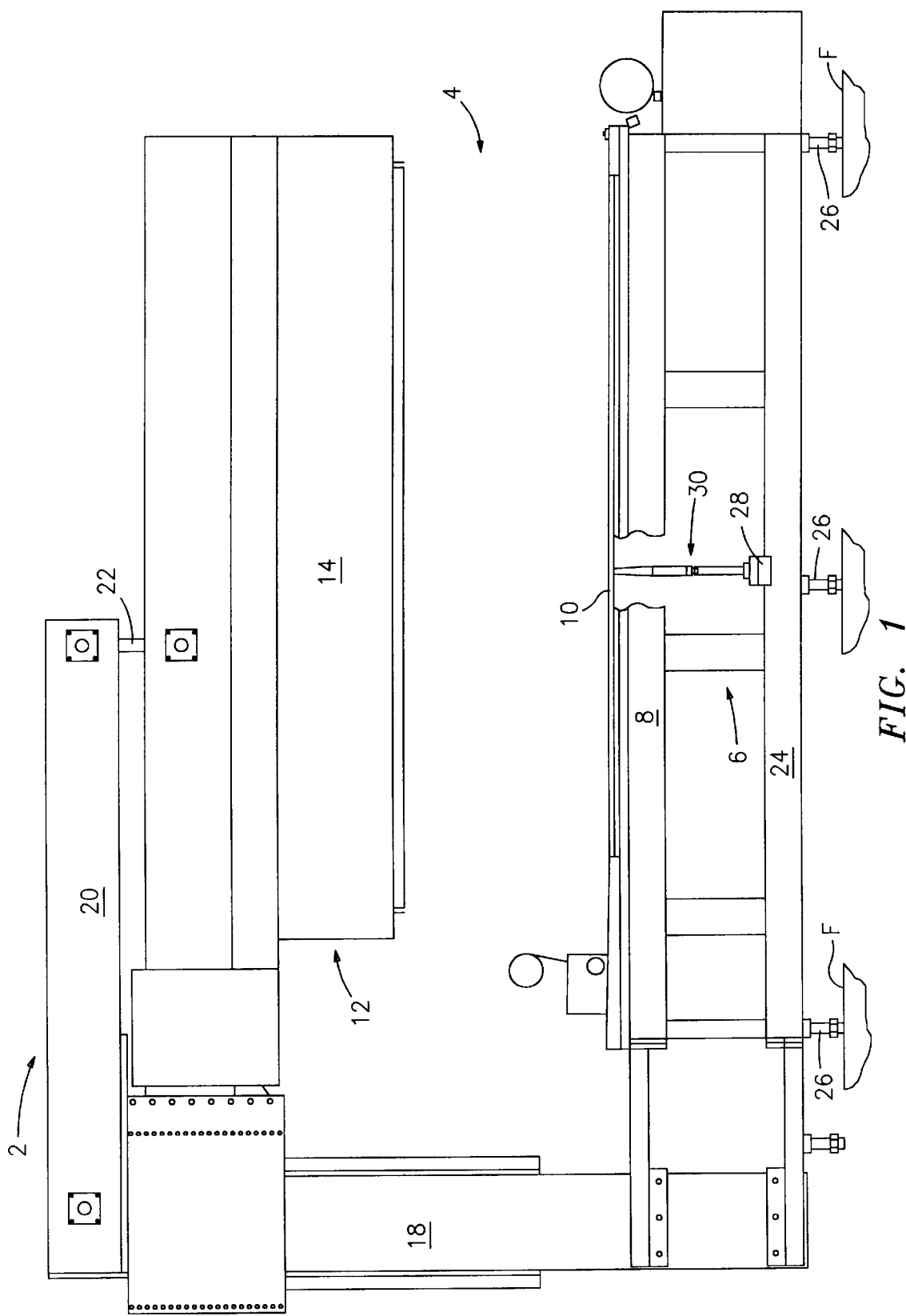
FIG. 1 is an elevation view, partly cut away, of a flat printing plate-producing assembly which is formed in accordance with this invention.

Referring now to the drawings, there is shown in FIG. 1 an embodiment of an improved printing plate-manufacturing assembly, which is denoted generally by the numeral 2. The assembly 2 includes a photopolymer exposure assembly or fixture denoted generally by the numeral 4. The fixture 4 includes a lower light table 6 inside of which is located a lower UV light source 8. A lower glass plate 10 is disposed on the table 6 above the lower UV light source 8. The negative, which defines the printing plate print surface, is disposed on the lower glass plate 10. An upper fixture assembly 12 is disposed above the lower light table 6. The upper fixture assembly 12 includes an upper UV light source 14 and an upper glass plate positioned below it. The fixture 4 includes a guide post 18 which supports the upper fixture assembly 12 and guides movement thereof toward and away from the lower light bank table 6, preferably by means of a hydraulic jack and safety counter weight assembly. A crane 20 is connected to the upper fixture assembly 12 by means of a hanger pin 22. The lower fixture 6 includes lower side rails 24 on which support legs 26 are mounted. The legs 26 are operable to properly position and support the assembly 2 on a floor F. A transverse base 28 is connected to and extends between the side rails 24, and the lower glass plate support post assembly 30 is mounted on the base 28. It will be noted that the post assembly 30 extends from the base 28 upwardly and engages the lower surface of the lower glass plate 10.

Figure 2:
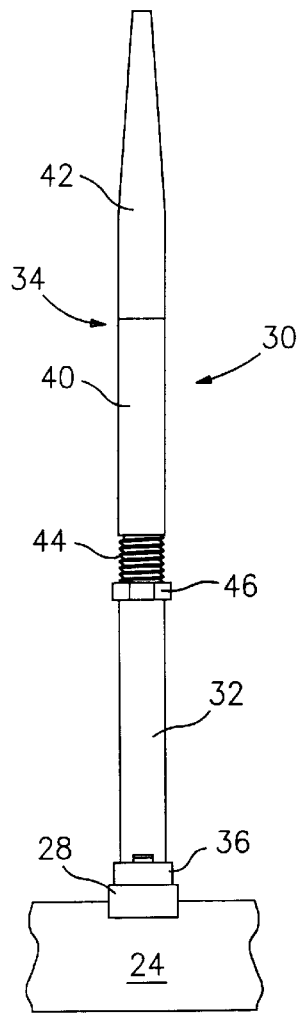
FIG. 2 is an elevational view of the lower glass-supporting element of FIG. 1.
Figure 3:
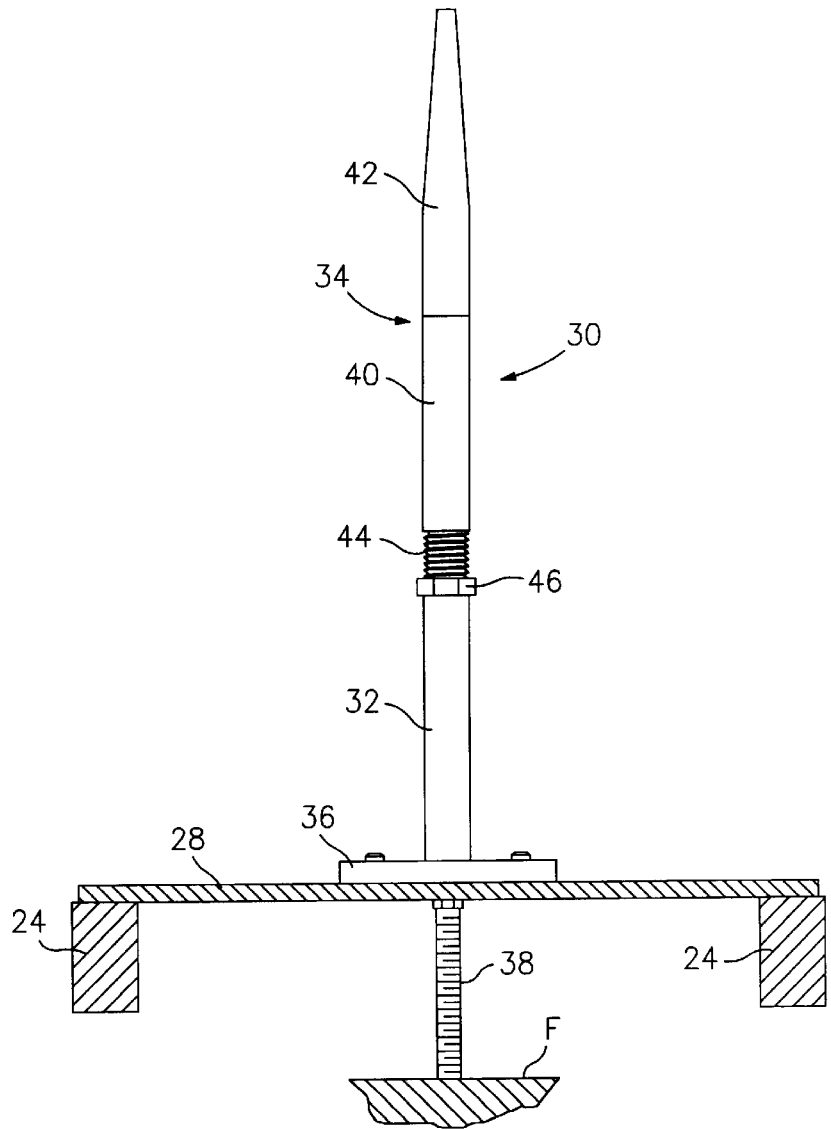
FIG. 3 is an elevational view of the lower glass-supporting element as seen from the right hand side of FIG. 2.

Referring now to FIGS. 2 and 3, details of the lower glass plate-support post assembly 30 are shown. The support post assembly 30 includes a lower pedestal component 32 and an upper jack component 34. The pedestal 32 is secured to a plate 36 that is, in turn, bolted to the base 28. A threaded foot 38 extends beneath the base 28 and engages the floor F, or a support portion of the lower fixture assembly 6. Thus, the support post assembly 30 can be supported by the floor F or by a support portion of the lower fixture assembly 6, and by the base 28. The jack component 34 includes a lower metal part 40 and an upper transparent part 42. The upper transparent part 42 is preferably made of a clear polycarbonate plastic material, but could also be made from any other durable transparent material. The pedestal 32 has a threaded bore into which a complementary threaded extension 44 on the metal part 40 is screwed. This allows the jack component 34 to be selectively raised or lowered relative to the pedestal 32. Once the jack component 34 is properly positioned relative to the lower glass plate 10, a lock nut 46, which is threaded onto the extension 44, is tightened down against the pedestal 32 so as to hold the jack component 34 in its proper position. The support post assembly 30 can thus be adjusted so as to provide support to the central portion of the lower glass plate 10 and thus can establish and maintain the preferred planar condition of the plate 10. The support post assembly 30 can also be locked in its adjusted position on the lower fixture assembly 6.

It will be readily appreciated that the assembly of this invention can be utilized to create and maintain a planar condition on the lower glass plate during deposition, doctoring and cross linking of the resin layer on the lower glass plate. The assembly also ensures the formation of relatively constant thickness resin layers on the lower glass plate, thereby enhancing the quality of the image print surface of the printing plate. The assembly also allows the use of larger lower glass plates so as to enable the production of larger printing plates. The assembly of this invention can be included as original equipment, and can also be retrofitted onto existing printing plate production fixtures. The assembly is relatively simple, inexpensive and does not interfere with the field of UV light cast upon the resin layer during the cross-linking step.

Since many changes and variations of the disclosed embodiment of the invention may be made without departing from the inventive concept, it is not intended to limit the invention otherwise than as required by the appended claims.

What is claimed is:

1. An assembly for producing printing plates from a photopolymerizable resin layer, said assembly including:
   a) an upper fixture assembly, said upper fixture assembly including an upper glass plate above which an upper UV light source is located;
   b) a lower fixture assembly, said lower fixture assembly including a lower light bank table containing a lower UV light source, and also including a lower glass plate on which the resin layer is cast; and
   c) a support post assembly positioned in the lower fixture assembly for supporting a central portion of the lower glass plate so as to limit downward deflection of said lower glass plate, said support post assembly having a transparent portion which engages the lower glass plate and allows light transmission from said lower UV light source to a resin layer which resin layer is supported by the lower glass plate.

2. The assembly of claim 1 wherein said support post assembly includes a lower metal portion below said transparent portion, said transparent and lower metal portions being interconnected by a threaded joint so as to enable minute adjustment of the transparent portion relative to the lower glass plate.

3. The assembly of claim 2 wherein said threaded joint includes a lock nut operable to secure said transparent portion of said support post assembly relative to said lower glass plate.

4. The assembly of claim 2 wherein said lower metal portion of the support post assembly includes an adjustable foot which is threadedly connected to said lower metal portion of said support post assembly so as to provide additional support for said support post assembly and said lower glass plate.

5. A method for producing printing plates from a photopolymerizable resin layer, said method comprising the steps of:
   a) providing an upper fixture assembly that includes an upper glass plate above which an upper UV light source is located;
   b) providing a lower fixture assembly which includes a lower light bank table containing a lower UV light source, and also includes a lower glass plate on which the resin layer is cast;
   c) providing a support post assembly positioned in the lower fixture assembly for supporting a central portion of the lower glass plate so as to limit downward deflection of said lower glass plate, said support post assembly having a vertically adjustable upper transparent portion which engages the lower glass plate and allows light transmission from said lower UV light source to a resin layer which is supported by the lower glass plate; and
   d) vertically adjusting said upper transparent portion of said support post assembly relative to said lower glass plate so as to minimize vertical deflection of said lower glass plate during production of a printing plate.

\* \* \* \* \*